(12) United States Patent
Wernersson et al.

(10) Patent No.: US 10,090,292 B2
(45) Date of Patent: Oct. 2, 2018

(54) RADIAL NANOWIRE ESAKI DIODE DEVICES AND METHODS

(71) Applicant: QUNANO AB, Lund (SE)

(72) Inventors: Lars-Erik Wernersson, Lund (SE); Erik Lind, Lund (SE); Jonas Ohlsson, Malmo (SE); Lars Samuelson, Malmo (SE); Mikeal Bjork, Lomma (SE); Claes Thelander, Lund (SE); Anil Dey, Lund (SE)

(73) Assignee: QUNANO AB, Lund (SE)

( * ) Notice: Subject to any disclaimer, the term of this patent is extended or adjusted under 35 U.S.C. 154(b) by 127 days.

(21) Appl. No.: 14/407,007

(22) PCT Filed: Jul. 5, 2013

(86) PCT No.: PCT/IB2013/001856
§ 371 (c)(1),
(2) Date: Dec. 10, 2014

(87) PCT Pub. No.: WO2014/006503
PCT Pub. Date: Jan. 9, 2014

(65) Prior Publication Data
US 2015/0171076 A1    Jun. 18, 2015

Related U.S. Application Data

(60) Provisional application No. 61/668,777, filed on Jul. 6, 2012.

(51) Int. Cl.
*H01L 31/068* (2012.01)
*H01L 27/06* (2006.01)
(Continued)

(52) U.S. Cl.
CPC .......... *H01L 27/0629* (2013.01); *B82Y 10/00* (2013.01); *H01L 29/068* (2013.01);
(Continued)

(58) Field of Classification Search
CPC . H01L 29/068; H01L 29/7391; H01L 29/885; H01L 29/0676; H01L 29/122;
(Continued)

(56) References Cited

U.S. PATENT DOCUMENTS 7,335,908 B2    2/2008  Samuelson et al.
7,829,443 B2   11/2010  Seifert et al.
(Continued)

FOREIGN PATENT DOCUMENTS

CN    101803035 A    8/2010
EP      1892769 A2   2/2008
(Continued)

OTHER PUBLICATIONS

European Search Report for EP Application No. 13813238.6, dated Jan. 15, 2016, 7 pages.
(Continued)

*Primary Examiner* — Matthew T Martin
*Assistant Examiner* — Dujuan A Horton
(74) *Attorney, Agent, or Firm* — The Marbury Law Group PLLC

(57) ABSTRACT

A radial nanowire Esaki diode device includes a semiconductor core of a first conductivity type and a semiconductor shell of a second conductivity type different from the first conductivity type. The device may be a TFET or a solar cell.

6 Claims, 16 Drawing Sheets

(51) Int. Cl.
| | |
|---|---|
| *B82Y 10/00* | (2011.01) |
| *H01L 29/739* | (2006.01) |
| *H01L 29/885* | (2006.01) |
| *H01L 29/06* | (2006.01) |
| *H01L 29/205* | (2006.01) |
| *H01L 29/786* | (2006.01) |
| *H01L 31/0352* | (2006.01) |
| *H01L 31/06* | (2012.01) |
| *H01L 29/12* | (2006.01) |
| *H01L 29/66* | (2006.01) |
| *H01L 29/78* | (2006.01) |
| *H01L 31/0687* | (2012.01) |
| *H01L 29/51* | (2006.01) |

(52) U.S. Cl.
CPC ...... *H01L 29/0669* (2013.01); *H01L 29/0676* (2013.01); *H01L 29/122* (2013.01); *H01L 29/205* (2013.01); *H01L 29/66977* (2013.01); *H01L 29/7391* (2013.01); *H01L 29/78* (2013.01); *H01L 29/78642* (2013.01); *H01L 29/885* (2013.01); *H01L 31/035227* (2013.01); *H01L 31/06* (2013.01); *H01L 31/068* (2013.01); *H01L 31/0687* (2013.01); *H01L 29/517* (2013.01); *Y02E 10/50* (2013.01)

(58) Field of Classification Search
CPC . H01L 29/0669; H01L 29/517; H01L 31/068; H01L 31/0687; Y02E 10/50
USPC .......................................... 136/252
See application file for complete search history.

(56) References Cited

U.S. PATENT DOCUMENTS

| | | | |
|---|---|---|---|
| 2007/0052012 A1 | 3/2007 | Forbes | |
| 2008/0067495 A1 | 3/2008 | Verhulst | |
| 2008/0149914 A1 | 6/2008 | Samuelson et al. | |
| 2011/0089400 A1 | 4/2011 | Ohlsson et al. | |
| 2012/0032148 A1* | 2/2012 | Olson | H01L 31/03529 257/21 |

FOREIGN PATENT DOCUMENTS

| | | | |
|---|---|---|---|
| EP | 2472585 A1 | 7/2012 | |
| JP | 2008182226 A | 8/2008 | |
| WO | WO2006135336 A1 | 12/2006 | |
| WO | WO2008079077 A2 | 7/2008 | |
| WO | WO 2010120233 A2 * | 10/2010 | ....... H01L 31/03529 |
| WO | WO 2011/049529 A1 | 4/2011 | |

OTHER PUBLICATIONS

European Office Communication for EP Application No. 13813238.6, dated Feb. 23, 2016, 1 page.
Bjork, M. et al., "Nanowire Tunnel FETs," 2nd Berkeley Symposium on Energy Efficient Electronic Systems, XP055105848, 34 pages, (2011).
International Search Report received in connection with international application No. PCT/IB2013/001856; dated Jan. 20, 2014.
International Preliminary Report on Patentability received in connection with international application No. PCT/IB2013/001856; dated Jan. 15, 2015.
Björk et al., "Nanowire Tunnel FETs", $2^{nd}$ Berkeley Symposium on Energy Efficient Electronic systems, Berkeley, CA, Nov. 3-4, 2011.
Borg et al., "Influence of doping on the electronic transport in GaSb/InAs(Sb) nanowire tunnel devices", Applied Physical Letters, vol. 101, 043508, (2012).
Borgstrom et al., "Nanowires with Promise for Photovoltaics", IEEE Journal of Selected Topics in quantum Electronics, vol. 17(4), pp. 1050-1061 (2011).
Dey et al., "High Current GaSb/InAs(Sb) Nanowire Tunnel Field-Effect Transistors", IEEE Electron Device Letters, vol. 34(2), 2013, pp. 211-213.
Ek et al., "Formation of the Axial Heterojunction in GaSb/InAs(Sb) Nanowires with High Crystal Quality", Crystal Growth & Design, vol. 11, pp. 4588-4593 (2011).
Fung et al., "Esaki tunnel diodes based on vertical Si—Ge nanowire heterojunctions", Applied Physical Letters, vol. 99, 092108, (2011).
Ganjipour et al., "High Current Density Esaki Tunnel Diodes Based on GaSb—InAsSb Heterostructure Nanowires", Nano Lett. 2011, vol. 11, pp. 4222-4226.
Schmid et al., "Silicon Nanowire Esaki Diodes", *Nano Lett.*, 2012, 12 (2), pp. 699-703.
Wallentin et al., "High Performance Single Nanowire Tunnel Diodes", Nano Lett. 2010, vol. 10, pp. 974-979.
Chinese Office Communication for Chinese Patent Application No. 201380036099.4, dated Nov. 18, 2016, 6 pages.
Japanese Office Communication, Notice of Reasons for Rejection, for Japanese Patent Application No. 2015-519381, dated May 30, 2017, 5 pages, with English-language translation.

* cited by examiner

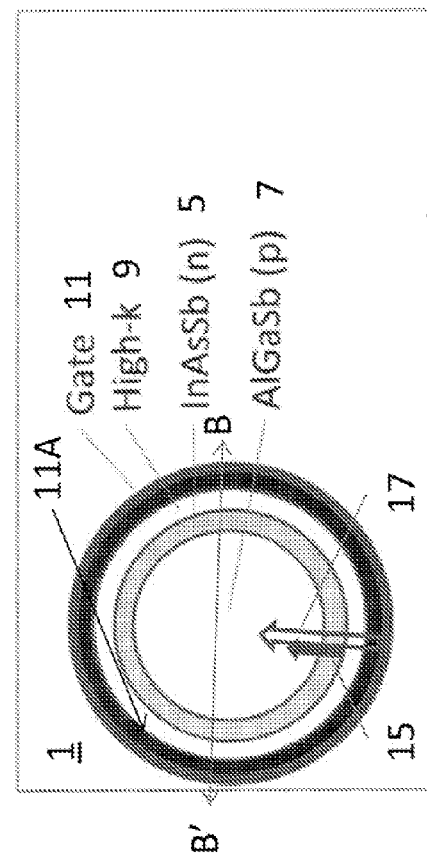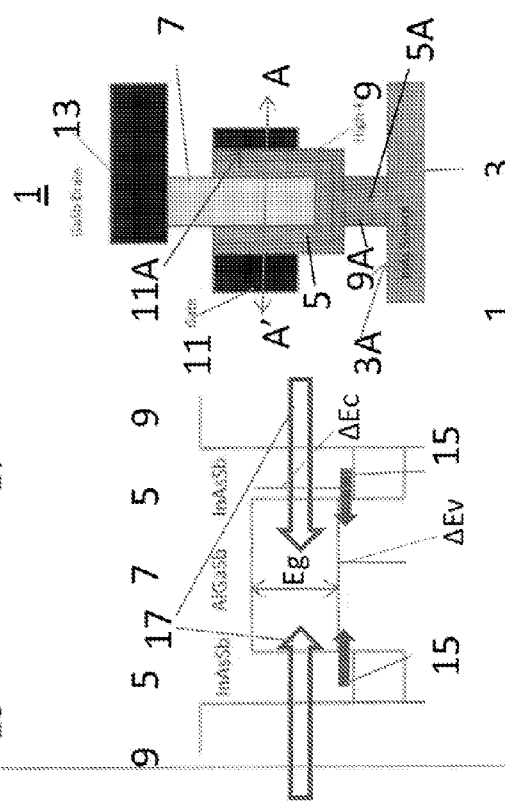
FIGURE 1A
FIGURE 1B
FIGURE 1C

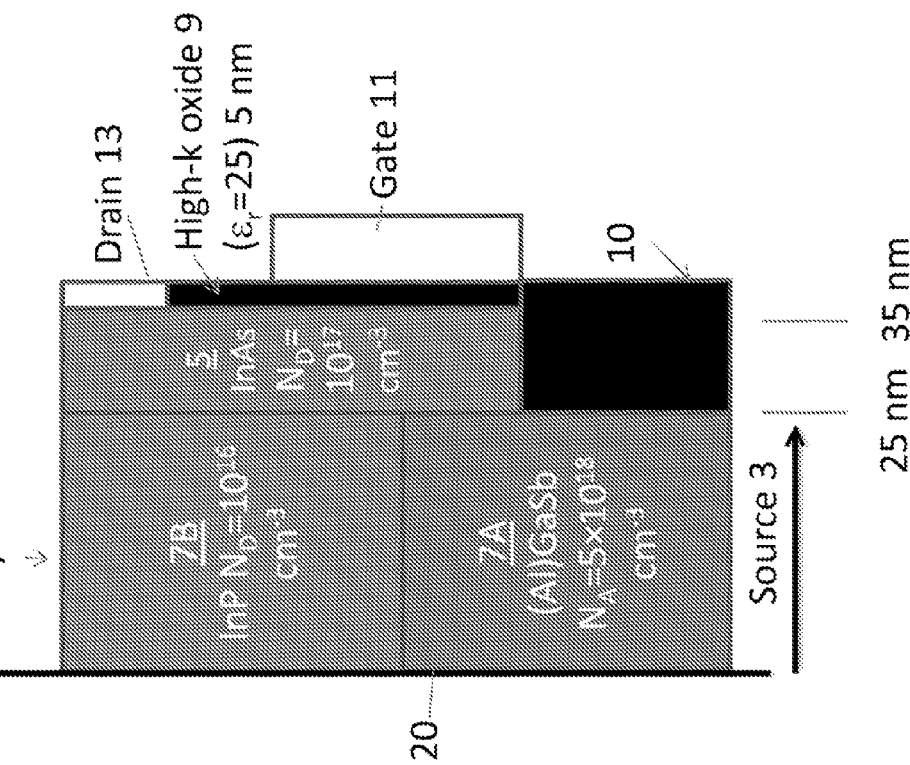
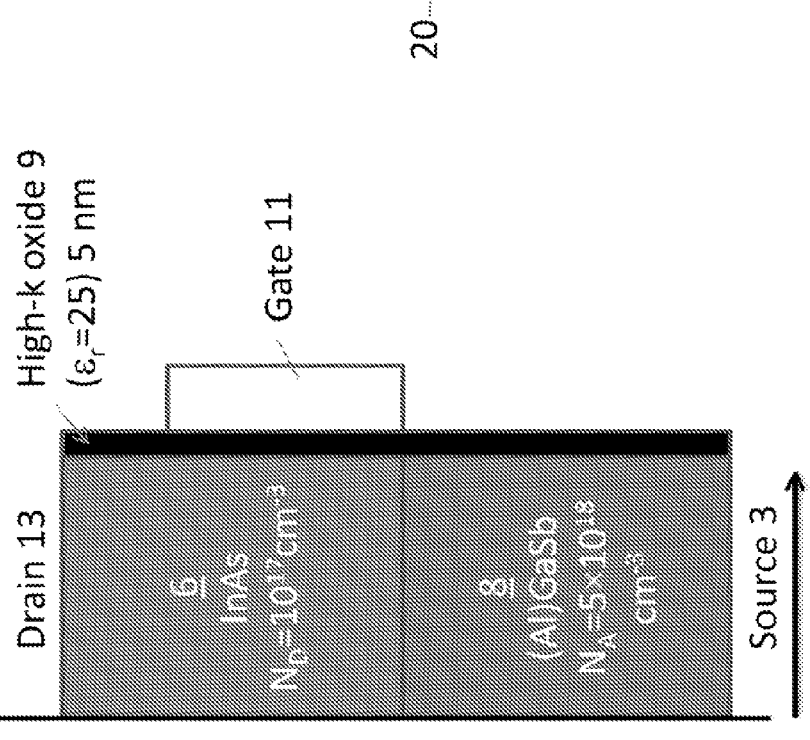

RADIAL NANOWIRE ESAKI DIODE DEVICES AND METHODS

BACKGROUND

Tunnel or tunneling field effect transistors ("TFET") in the form of gated Esaki diodes (e.g., gated diodes having a negative resistance characteristics and/or operating in the reverse or Zener direction) are currently considered for digital applications operating at $V_{DD} \leq 0.3V$. The main merit of these transistors is the possibility to reduce the off current at reduced gate swing using the steep slope where the transistors operate below the thermal limit of kT/q. The transistor operation relies on a band pass effect where the drive current is obtained based on tunneling across the bandgap (e.g., electrons tunneling from the conduction band of the n-type semiconductor material into a valence band of an adjacent p-type semiconductor material of a pn junction) that is controlled via the transistor gate. The off-current is reduced by the limited number of available states as the band gap is blocking direct tunneling of the carriers.

The main figures of merit for the tunnel transistor include the drive current, that is the current-level in the on-state, inverse sub-threshold slope (or sub-threshold swing) as well as the off-state current that defines how accurately the transistor may be turned off. The off-state is generally not an issue for a TFET since the off-state current is dictated by the reverse leakage current of the pn junction. Generally it is known to be difficult to obtain both a high drive current as well as a steep slope in the sub-threshold region. Part of the problem is related to the requirement of accurate alignment of the gate electrode with the pn-junction, where misalignment will reduce the gate effect and lower the electric field across the junction. High doping levels on either side of the junction will increase the drive currents but on the other hand the high doping levels will degrade the inverse sub-threshold slope because of the introduction of band tail states in the bandgap. An important aspect of steep slope tunnel devices is the amount of thermally excited carriers that take part in the tunneling; any potential pockets induced in the vicinity of the junction will introduce a thermal population of carriers (via the Fermi-Dirac function). If the tunneling is supplied by those carriers, the sub-threshold swing is immediately degraded to, at best, 60 mV/decade (the theoretical limit of thermally injected carriers). This is generally the case for TFET devices.

It is also known that the Esaki diodes preferably are fabricated in materials with small effective mass to increase the tunneling current and that heterostructures preferably are used to increase the drive current, one example being InAs/GaSb. Further problems are the effect of the D, that will increase the slope and in particular for heterostructure devices it is challenging to identify and to process high-κ dielectrics which are compatible with different semiconductor materials.

SUMMARY

In an embodiment, a device comprises a radial nanowire Esaki diode, where the radial nanowire comprises a semiconductor core of a first conductivity type and a semiconductor shell of a second conductivity type different from the first conductivity type.

In one embodiment, the device comprises a gated Esaki diode (e.g., TFET) which includes a radial semiconductor nanowire. The tunneling current between oppositely doped core and shell of the radial semiconductor nanowire flows substantially parallel to an electrical field provided by a gate electrode to the radial semiconductor nanowire.

In another embodiment, the device comprises a multi-junction solar cell which includes a planar solar cell and the radial nanowire Esaki diode.

DESCRIPTION OF THE DRAWINGS

FIGS. 1A and 1B are respective top and side cross sectional views of a radial nanowire TFET device along lines B'-B and A'-A respectively. FIG. 1C is a band diagram of the device of FIGS. 1A and 1B.

FIGS. 10A and 10B are side cross sectional views of a right side portion of a simulated TFET containing an axial and radial nanowire, respectively, that were used for the respective simulations in FIGS. 4, 6, 7 and 5, 8, 9 respectively.

DESCRIPTION OF EMBODIMENTS

Figure 2:
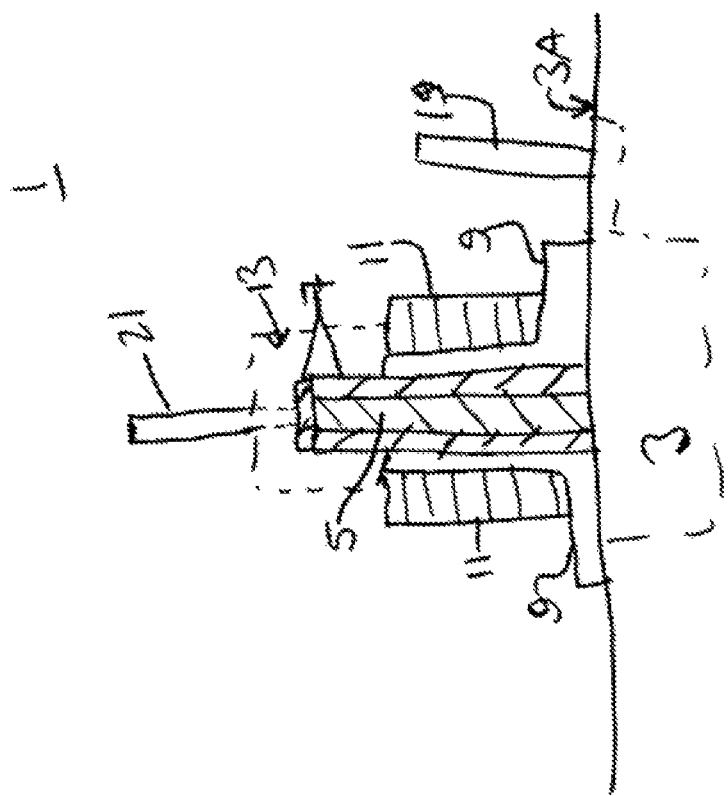
FIG. 2 illustrates a side cross sectional view of an alternative embodiment of a TFET.

The embodiments of the present invention are based on nanostructures including so-called nanowires. For the purpose of this application, nanowires are to be interpreted as having nanometer dimensions in their width and diameter and typically having an elongated shape. Such structures are commonly also referred to as nanowhiskers, nanorods, nanotubes, one-dimensional nanoelements, etc.

Preferably, the nanowire is an essentially rod-shaped semiconductor structure with a diameter less than 1 micron, such as 500 nm or less and a length up to several microns. The nanowire is at its base connected to a substrate, which may include epitaxial semiconductor layers below the nanowire.

The basic process of nanowire formation on substrates by particle assisted growth or the so-called VLS (vapor-liquid-solid) mechanism described in U.S. Pat. No. 7,335,908, incorporated herein by reference in its entirety, as well as different types of Chemical Beam Epitaxy and Vapor Phase Epitaxy methods, are well known. However, the present invention is limited to neither such nanowires nor the VLS process.

Other suitable methods for growing nanowires are known in the art and are for example shown in U.S. Pat. No. 7,829,443, incorporated herein by reference in its entirety. From this it follows that nanowires may be grown without the use of a particle as a catalyst. The nanowire protrudes through an opening in a growth mask, such as a mask made of silicon nitride or another insulating layer. The nanowire is grown by first providing a growth mask over a substrate and producing openings in the growth mask. The openings are preferably well controlled, both in regards to their diameter and their relative positioning. Several techniques known in the art can be used for the procedure including, but not limited to electron beam lithography (EBL), nanoimprint lithography, optical lithography and reactive ion etching (RIE) or wet chemical etching methods. Preferably the openings are approximately 100 nm in diameter and pitched 0.5-5 µm apart. The openings define the position and the diameter of the nanowires to be produced. The semiconductor nanowire core is then grown by a CVD based process. A radial semiconductor shell can then be formed around the core.

Thus, selectively grown nanowires and nanostructures, etched structures, other nanowires, and structures fabricated from nanowires are also included.

Nanowires are not homogeneous along the radial direction (or width direction for nanowires having a non-circular cross section when viewed from the top) thereof. The nanometer dimensions enable not only growth on substrates that are not lattice matched to the nanowire material, but also heterostructures can be provided in the nanowire. The heterostructure(s) includes a core of a semiconductor material of different constitution than the adjacent shell part or parts of the nanowire. The material of the shell heterostructure segment(s) may be of different composition and/or doping than the core. The heterojunction can either be abrupt or graded.

One embodiment of the present invention provides a nanowire TFET device (e.g., gated Esaki diode) where the tunneling current flows in the radial direction of the nanowire structure and where a wrap gate is used to control the current flow, such that the gate electric field is substantially parallel to the tunneling current flow. In one embodiment, the tunneling current between the n-type and the p-type portions of the nanowire diode flows substantially parallel (e.g., within 0-20 degrees of parallel) to the major substrate surface supporting the nanowire and/or substantially perpendicular (e.g., within 20 degrees of perpendicular) to the surface of the gate electrode which faces the nanowire and the gate insulating layer located between the nanowire and the gate electrode. This allows the modulation of the potential as well as the electric field at the same time, both contributing to the current across the p-n or p-i-n junction of the diode.

The tunneling current in the radial tunneling field-effect transistor is modulated between two segments of the nanowire with different majority carriers, such as a p-type core and a n-type shell or vice versa. A maximum tunneling transport efficiency is attained when transport through thermal excitation of carriers is minimized and the carrier transport is dominated by a direct tunneling mechanism. The proposed device will emphasize the tunneling contribution and limit other contributions, such as thermally excited carriers and diffusive transport under biased conditions. The ratio between the aforementioned contributions can be further enhanced by a barrier, introduced between reservoirs of carriers in the source and drain. The barrier or "plug" may comprise of a high bandgap semiconductor or a graded semiconductor and serves the purpose of minimizing the leakage currents perpendicular to the applied electric field from the gate, the gate positioned so that the dominating tunneling current is parallel to the electric field applied by the gate.

FIGS. 1A-1C illustrate a TFET according to one embodiment of the invention. The nanowire preferably includes a broken or staggered gap p-n junction such as an (Al)GaSb/InAs(Sb) radial heterostructure surrounded by a high-k gate dielectric and a wrap gate. Specifically, the nanowire 1 is grown on an n-type source region 3, such as an n-type InAs layer on a substrate and/or an n-type doped InAs region in a substrate. The nanowire includes an n-type InAsSb nanowire stem and radial shell portion 5 in contact with the source region and a p-type AlGaSb nanowire upper core portion 7. A gate insulating layer, such as a high-k dielectric layer (e.g., hafnium oxide, aluminum oxide, tantalum oxide, etc.) 9 surrounds the shell 5. A gate electrode 11 is located adjacent to the gate insulating layer 9, such that the gate insulating layer 9 is sandwiched between the gate electrode 11 and the nanowire shell 5. Preferably, but not necessarily, the gate electrode 11 is a hollow cylinder shaped wrap gate which completely surrounds the gate insulating layer 9 as shown in FIG. 1A. Alternatively, the gate electrode 11 may be located adjacent to one or more portions of the gate insulating layer rather than completely surrounding the gate insulating layer. A p-type GaSb drain region 13 is located in contact with the core 7 at the upper part of the nanowire 1. Source and drain electrodes (not shown for clarity) contact the respective source 3 and drain 13 regions. If desired, the separate source 3 and/or drain 13 regions outside the nanowire 1 may be omitted and the source and drain electrodes may directly contact respective regions 5 and 7 of the nanowire 1 which would function as the respective source and drain regions of the TFET. Furthermore, the position of the n-type and p-type regions may be reversed in the diode and any other suitable semiconductor materials may be used instead of the ones described above. In one particular alternative embodiment the nanowire core comprises an n-type InAsSb core surrounded by a p-type (Al)GaSb shell. In this embodiment, not only is the doping type reversed, but also the corresponding material. Any other suitable materials may be used for the core and the shell, exemplified but not limited by GaAsSb, GaInAs, InP and/or InPAs. In a preferred but non-limiting embodiment, the material choice in the core/shell heterostructure provides that the band alignment of the materials is staggered with either or both the conduction and valence band discontinuities ($\Delta Ec$, $\Delta Ev$) being between 0.5 and 1.5Eg, where Eg is the band gap energy (e.g., in units of eV). In other words, $0.5Eg < \Delta Ec < 1.5Eg$, or $0.5Eg < \Delta Ev < 1.5Eg$, as shown in FIG. 1C. Furthermore, band structure engineering may be accomplished by scaling the core/shell dimensions into the quantum regime which allows for precise control of the band alignment. In addition, carrier transport may be controlled by the discrete energy levels formed in a confined semiconductor allowing for a high selectivity of carriers available for transport. The above considerations may be used for any and/or all of the embodiment devices described herein.

As shown in FIGS. 1A-1C, the electric field 15 from the gate electrode 11 is oriented along the direction of the tunneling current 17 between regions 5 and 7. Thus, the tunneling current 17 direction between the n-type 5 and the p-type 7 portions of the nanowire diode is substantially parallel to the major substrate surface 3a supporting the nanowire and/or is substantially perpendicular to the surface 11a of the gate electrode 11 which faces the nanowire 1 and the gate insulating layer 9. As used herein, flows in the opposite directions (i.e., core to shell versus shell to core) are considered parallel.

Preferably, the InAsSb layer 5 is made sufficiently thin that a quantum well is formed between the gate insulating layer 9 and the core 7. This may allow the transistor to operate in the quantum capacitance limit. In other words, the potential in the InAsSb layer 5 is modulated by the potential from the surrounding gate electrode 11.

In one non-limiting configuration, the shell layer 5 is sufficiently thin to form quantized states in the quantum well that effectively increase the energy of the carriers. In one embodiment, the quantization energy is larger than the energy difference between the conduction and valence band edges in a broken gap heterostructure. This effectively introduces an energy separation between the lowest energy states in the n- and p-side, respectively, acting as a tunneling barrier even for materials combination that have a broken gap band alignment. In a further embodiment the core is made sufficiently thin to form quantized states that in a similar way increase the energy.

In one embodiment both the InAs(Sb) layer 5 and the (Al)GaSb layer 7 are sufficiently thin (for example below 20 nm in total thickness, such as 2-15 nm in total thickness) to minimize the tunnel distance and thereby increasing the tunnel current. In an embodiment, a graded doping profile can be present in the core 7, from a low doping at the interface to the stem 5A to a higher doping towards the drain 13, in order to maintain a uniform voltage drop, and in turn, a uniform tunneling current across the entire tunneling area (the interface between the shell 5 and the core 7). In other words, the doping is graded in the vertical direction in the device, where the doping concentration is lower in the bottom part than in the top part of the device.

The device shown in FIG. 1B can be fabricated according to the following method. First, an InAs(Sb) nanowire stem 5A is grown on the source region 3. Then, an axial (Al)GaSb heterostructure (i.e., upper nanowire core portion) 7 is grown on the stem 5A. The bottom part of the resulting nanowire (e.g., the stem 5A portion) is then subsequently protected by forming a masking layer 9A, such an electrically insulating layer (e.g., $SiN_x$, HSQ, $SiO_2$, etc). A shell 5 of InAs(Sb) is then grown on the nanowire, covering the outside of the nanowire except for bottom portion where the stem 5A is protected by the masking layer 9A. This forms the InAs(Sb) 5A/(Al)GaSb 7 axial heterostructure nanowire core coated with the radial InAsSb shell 5. The gate insulating layer 9 and the wrap gate electrode 11 are then formed around the radial nanowire.

FIG. 2 illustrates an alternative embodiment of a radial nanowire TFET. The device comprises at least one nanowire 1 comprising a nanowire core 7 grown on a substrate and at least a first shell layer 5 arranged on the core 7 and at least partly surrounding the nanowire core 5, to provide a radial heterostructure nanowire. The core 7 and the shell 5 are preferably made of opposite conductivity type (e.g., if the core 7 is p-type, then the shell 5 is n-type and vice-versa) semiconductor material to form a pn junction. If desired, an optional intrinsic shell layer may be located between the core 7 and the shell 5 to form a pin junction. A gate insulating layer 9 is located around the shell 5 and a gate electrode 11 is located adjacent to the gate insulating layer 9, such as wrapping around the gate insulating layer 9. The core 7 (e.g., n-type core) of the radial nanowire 1 may be located in contact with the same conductivity type semiconductor source region 3 (e.g., n-type region) in the substrate. A source electrode 19 may be located in contact with region 3 and a drain electrode 21 may be located in contact with the shell 5. If desired, an optional semiconductor drain region 13 (e.g., another shell layer or a quasi-bulk bulb) of the same conductivity type (e.g., p-type) may be located in contact with the shell 5, in which case the drain electrode 21 contacts the drain region 13. An optional interlayer insulating layer (not shown) may separate the gate electrode 9 from the source and drain electrodes 19, 21. It should be noted that the barrier "plug" region 7B described below and/or the graded core doping described above may also be added to the device of FIG. 2 if desired.

One non-limiting advantage of the embodiments of the present invention is that the electric field is oriented along the direction of the tunneling current and that the transistor does not necessarily rely on the field effect or depletion. A further advantage is that the high-k material 9 will only be in contact with one semiconductor material (e.g., region 5) which simplifies the material integration. Yet a further advantage is that the gated diode does not require any critical alignment to any heterostructure. Another advantage is that the current density may be high and the transistor is formed in a three dimensional array. Finally, the device does not require as aggressive diameter scaling as an axial device, as the critical dimension is set by the lateral overgrowth on the side facets.

Figure 3:
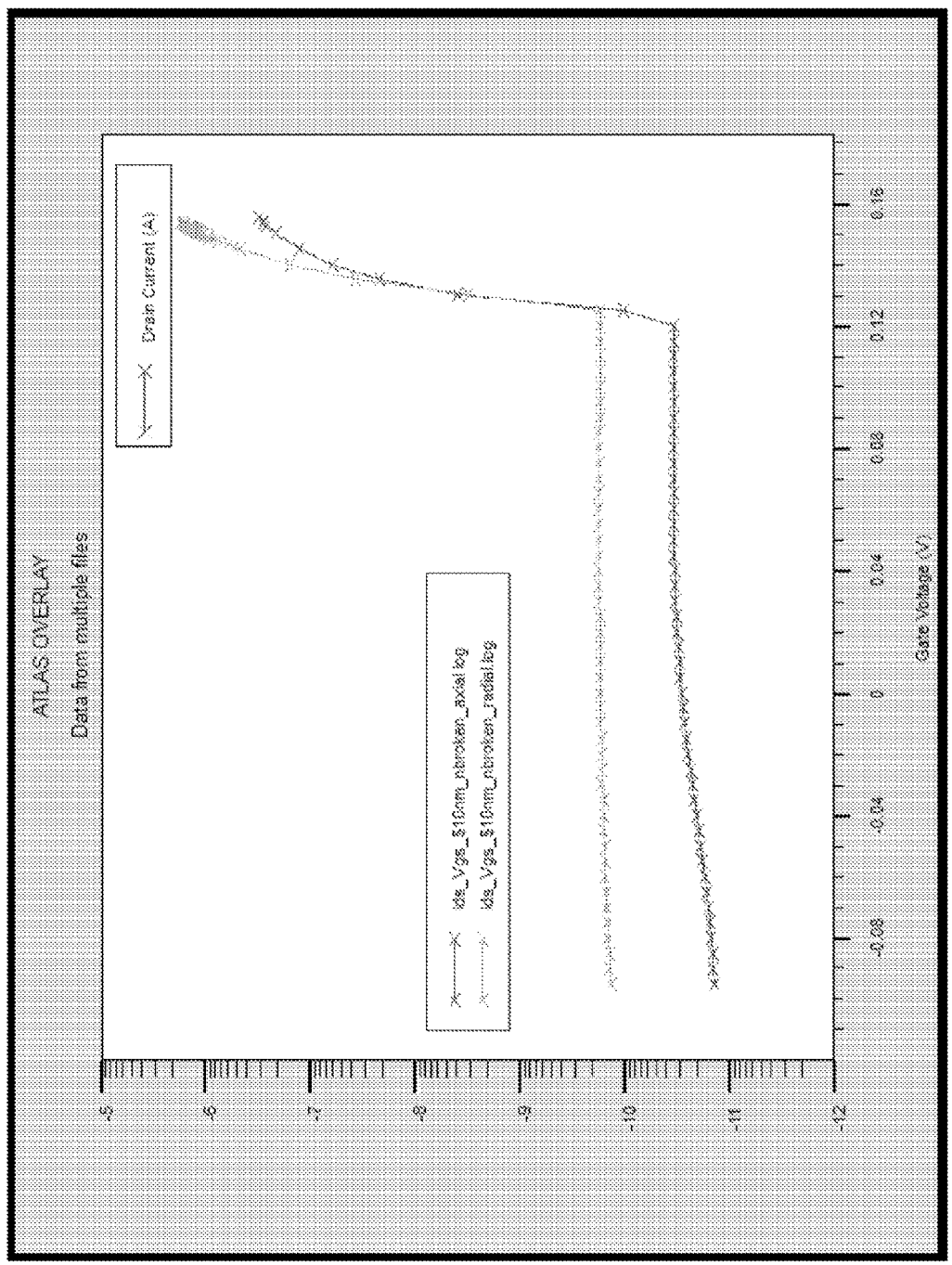
FIG. 3 is a simulation plot of drain current (drain to source current) versus gate voltage (gate to source voltage) for radial and axial TFETs.
Figure 4:
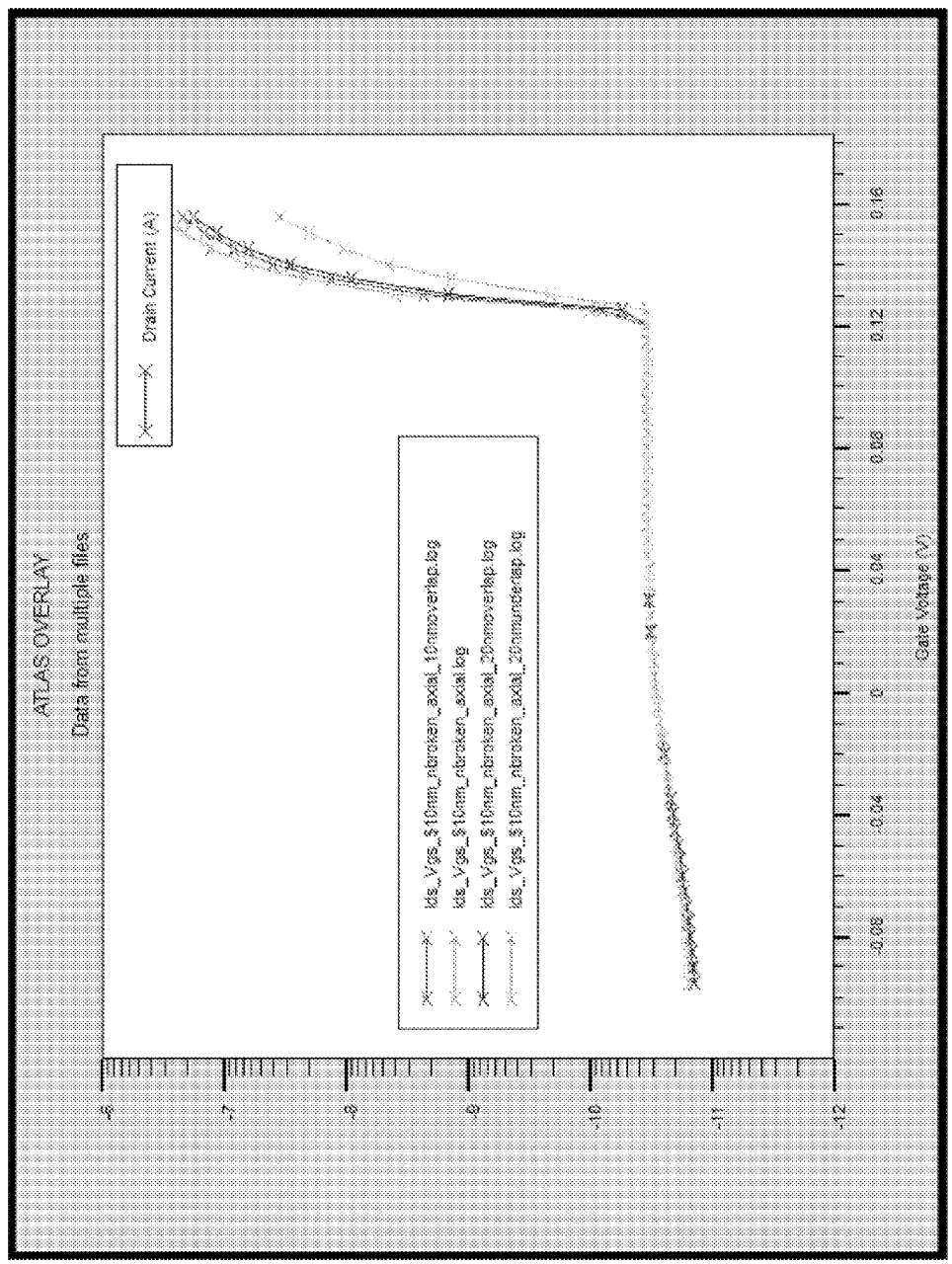
FIGS. 4 and 5 are simulation plots of drain current (drain to source current) versus gate voltage (gate to source voltage) for axial and radial TFETs, respectively.
Figure 5:
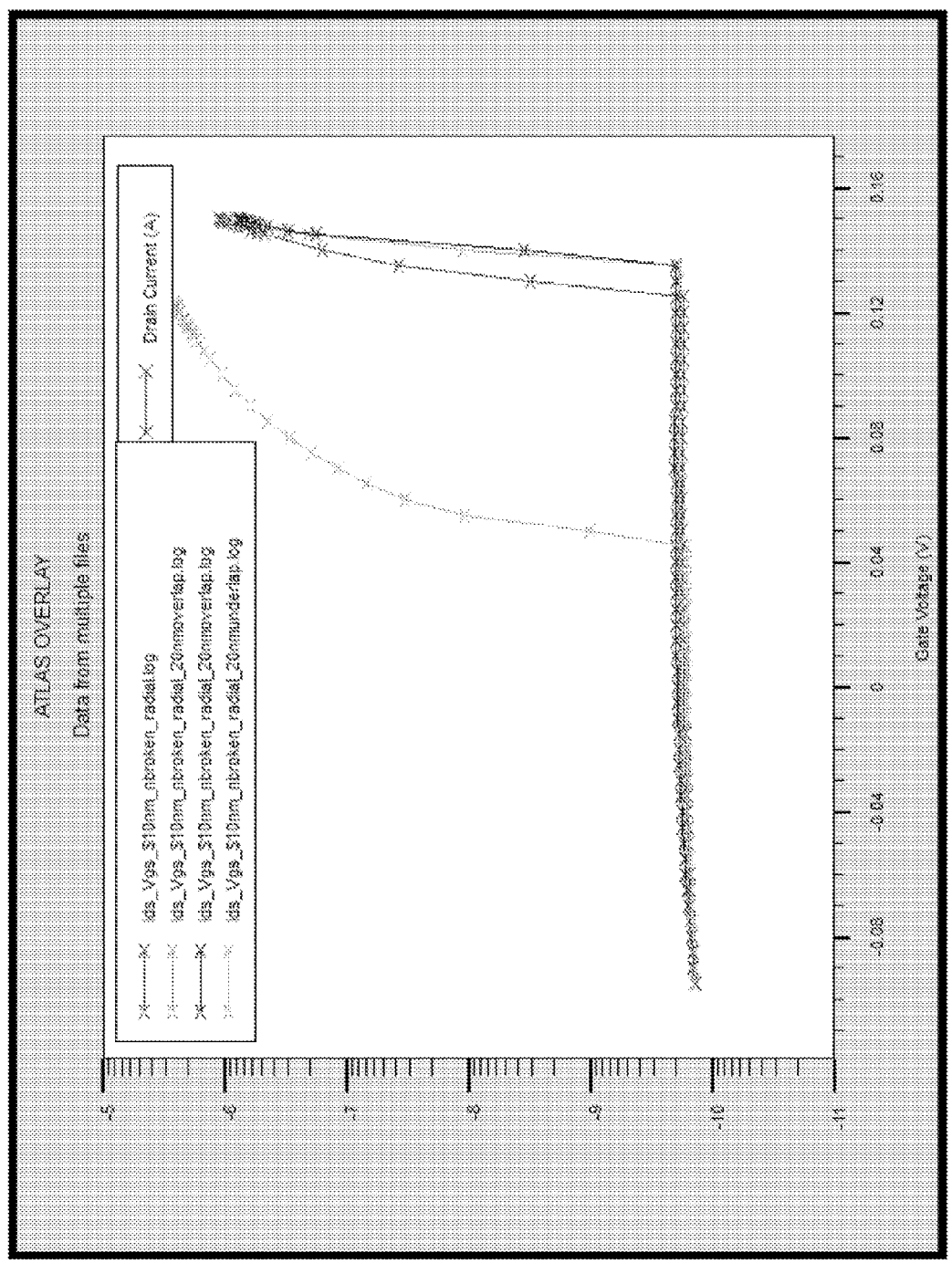
Figure 6:
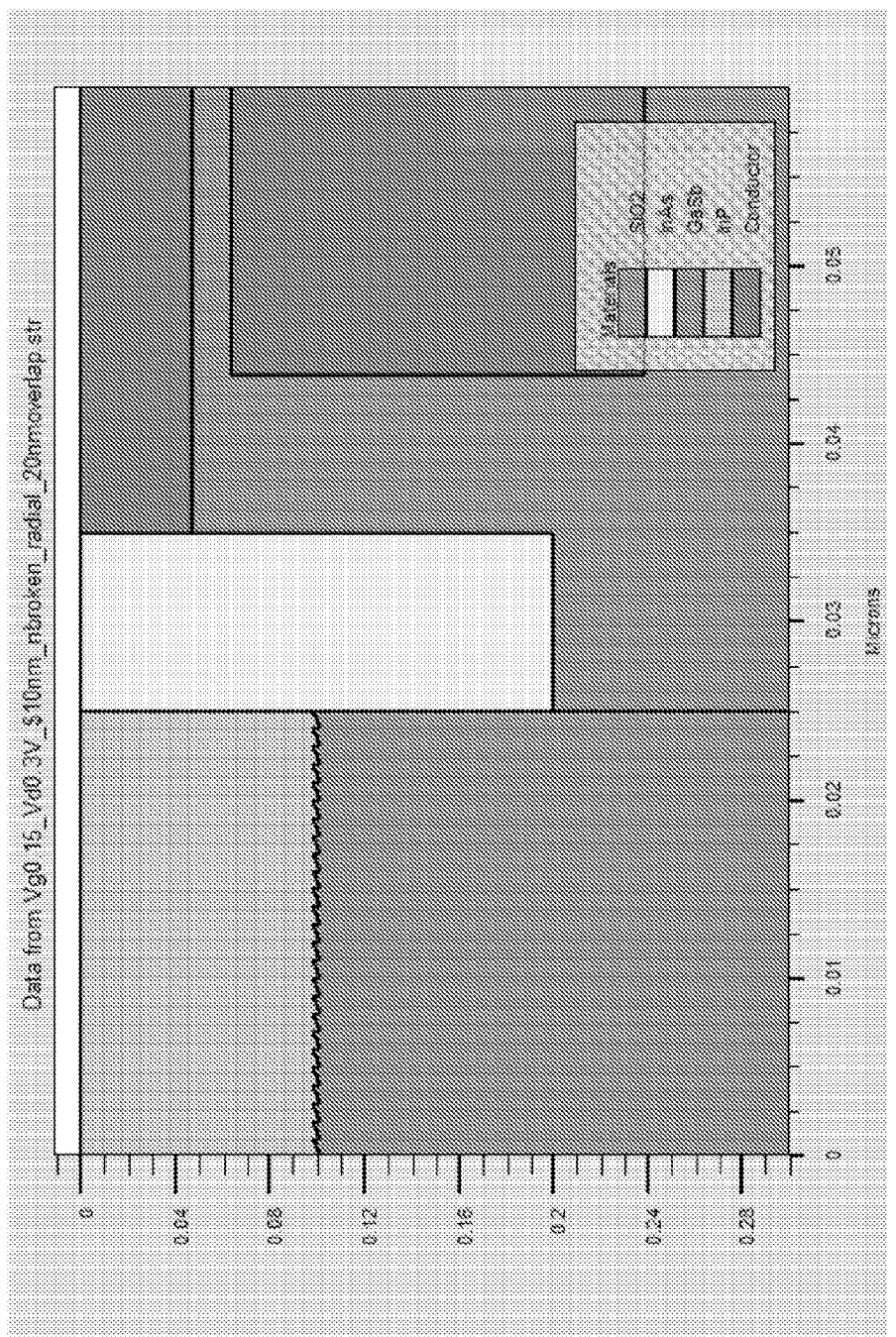
FIGS. 6-7 are dimensional plots of a radial TFET and FIGS. 8-9 are dimensional plots of an axial TFET.
Figure 7:
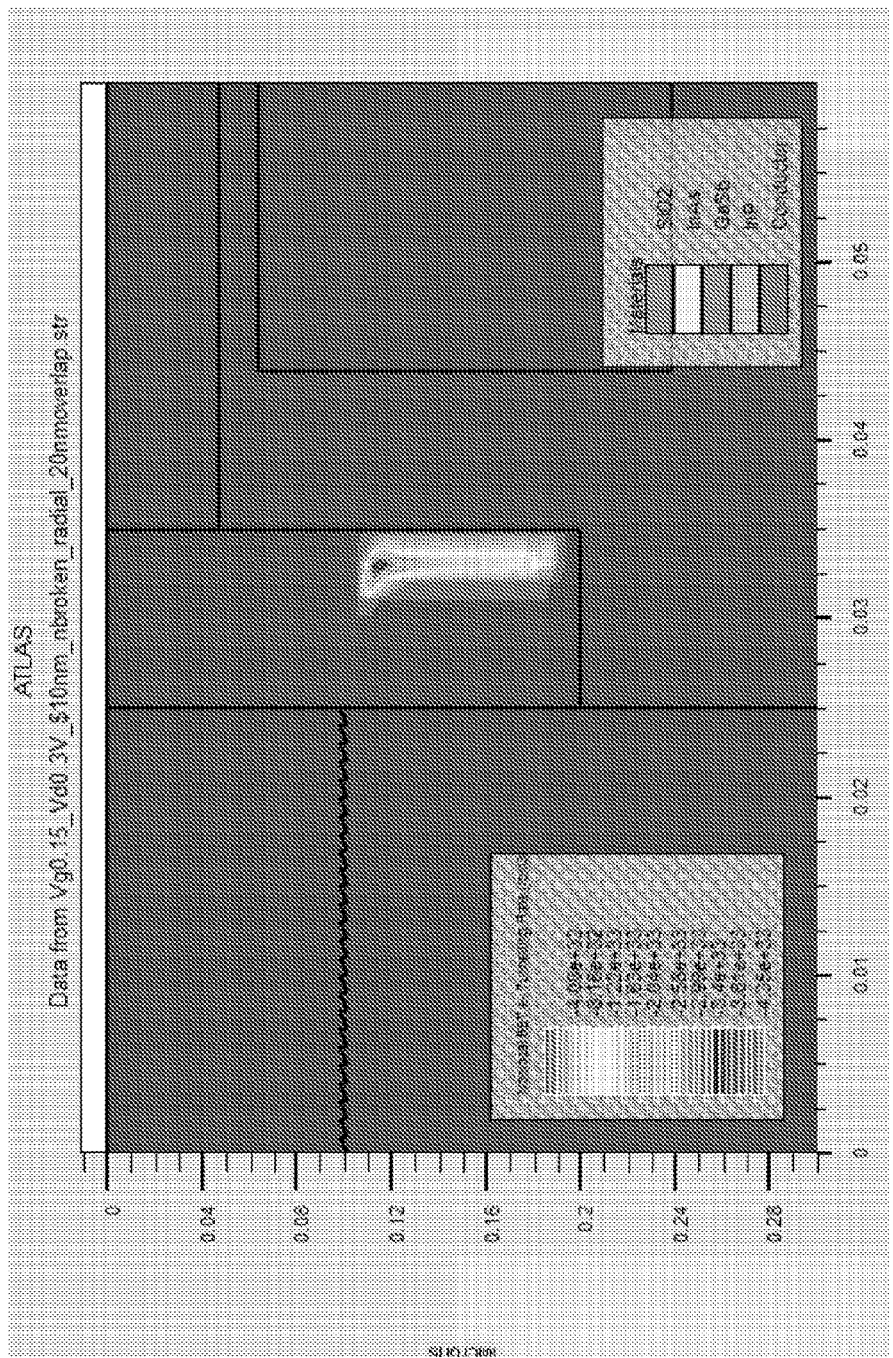
Figure 8:
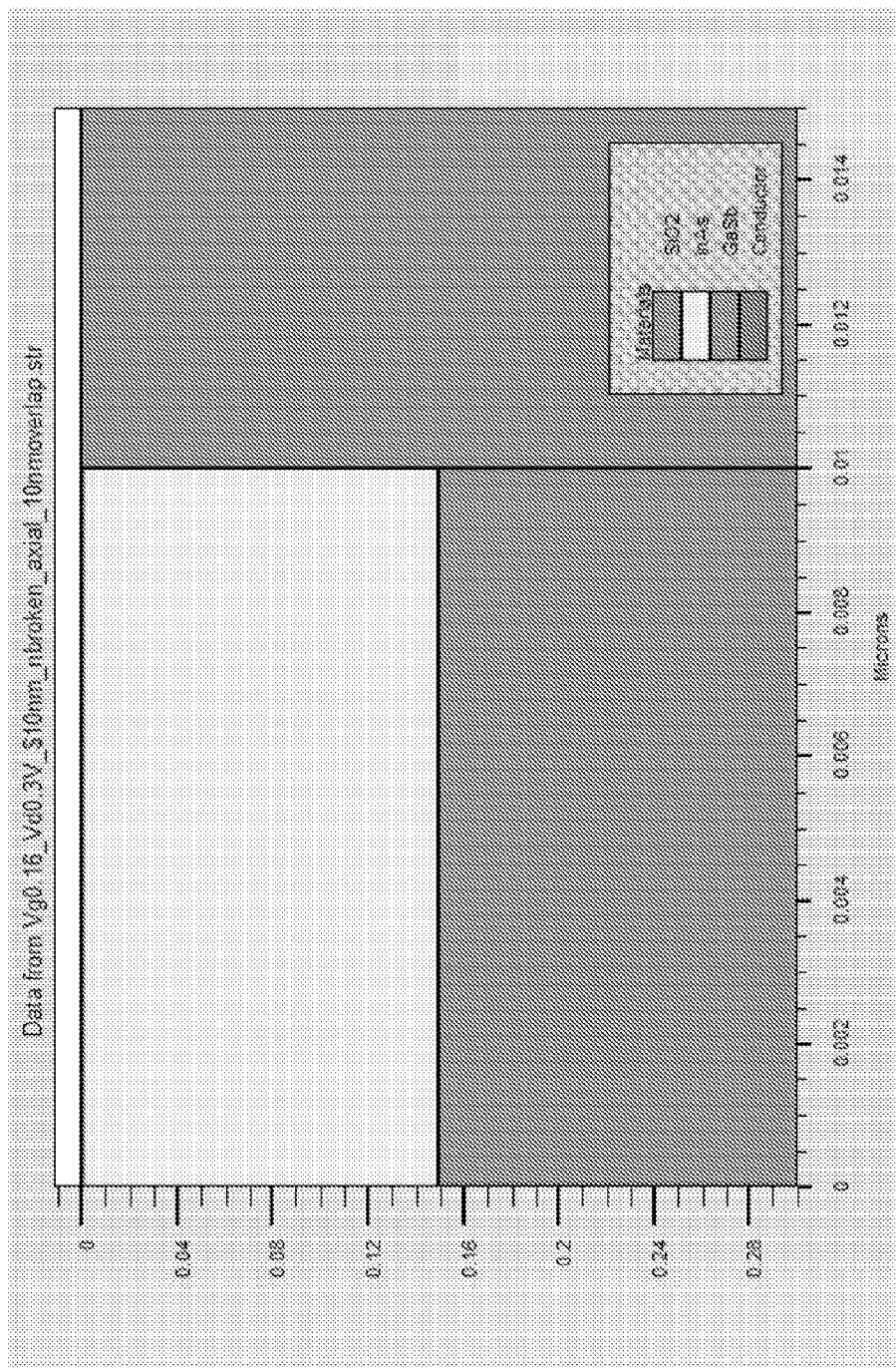
Figure 9:
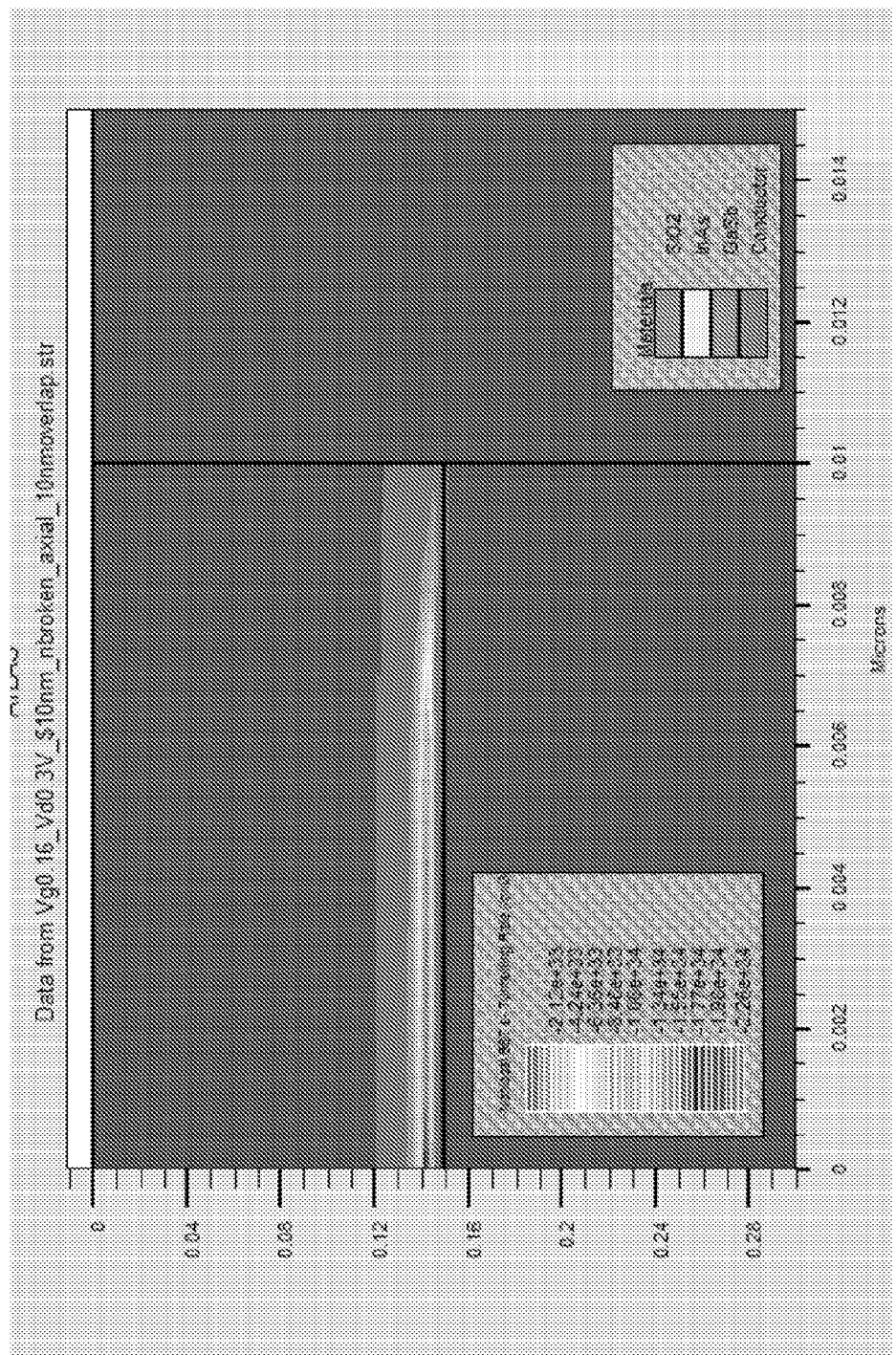

FIG. 3 is a simulation plot of drain current (drain to source current) versus gate voltage (gate to source voltage) for radial and axial TFETs. FIGS. 4 and 5 are simulation plots of drain current (drain to source current) versus gate voltage (gate to source voltage) for respective axial and radial TFETs. FIGS. 6-7 are dimensional plots of a radial TFET of the embodiments of the invention and FIGS. 8-9 are dimensional plots of an axial TFET of a comparative example. The non-local tunneling rate is shown in FIG. 7 in the radial nanowire shell and near the p-n junction in the axial nanowire in FIG. 9. FIGS. 10A and 10B are side cross sectional views of a right side portion of a simulated TFET containing an axial and radial nanowire, respectively, that were used for the respective simulations in FIGS. 4, 6, 7 and 5, 8, 9 respectively. In other words, FIGS. 10A and 10B only show the right side of the nanowire to the right of the vertical axis of symmetry.

The simulated axial nanowire shown in FIG. 10A contains a lower p-type semiconductor axial portion 8 over a source region 3 and an upper n-type semiconductor axial portion 6. A high-k oxide gate insulating layer 9 surrounds both portions 6, 8 of the nanowire and a wrap gate electrode 11 is located in contact with the gate insulating layer 9 adjacent to the upper portion 6 of the nanowire. A drain region 13 is located over portion 6. Portions 6 and 8 form a pn junction of the TFET. The nanowire radius is 25 nm, portion 6 comprises n-type InAs having a donor doping concentration, $N_D$, of $10^{17}$ cm$^{-3}$, and portion 8 comprises p-type (Al)GaSb having an acceptor doping concentration, $N_A$, of $10^{18}$ cm$^{-3}$. The gate insulating layer comprises a high-k oxide layer having a thickness of 5 nm and $\epsilon_r$=25.

The simulated radial nanowire shown in FIG. 10B contains a core 7 comprising a lower p-type semiconductor portion 7A over a source region 3 and an upper lightly doped n-type semiconductor portion (e.g., a barrier portion) 7B. A heavily doped n-type shell 5 is located around the core 7, such that the shell 5 wraps around the upper portion 7B and at least a top part of the lower portion 7A to form the pn junction of the TFET. A high-k oxide gate insulating layer 9 surrounds the shell 5 and a wrap gate electrode 11 is located in contact with the gate insulating layer 9 adjacent to the shell 5. An interlayer insulating layer 10 (which can be the same or different form the masking layer 9A shown in FIG. 1C) separates the gate electrode 11 and the shell 5 from the source region 3. A drain region 13 is located over portion 6. The nanowire core 7 radius is 25 nm, and the nanowire shell 5 radius is 10 nm, such that the entire semiconductor nanowire has a radius of 35 nm. The shell 5 comprises n-type InAs having a donor doping concentration, $N_D$, of $10^{17}$ cm$^{-3}$, and the lower core portion 7A comprises p-type (Al)GaSb having an acceptor doping concentration, $N_A$, of $10^{18}$ cm$^{-3}$. The upper core portion 7B is optional and comprises n-type InP having a donor doping concentration, $N_D$, of $10^{16}$ cm$^{-3}$. The gate insulating layer 9 comprises a high-k oxide layer having a thickness of 5 nm and $\in_r=25$.

The barrier portion 7B is provided to keep the TFET current flowing between the core 7A and the shell 5 of the nanowire, this is generally in the horizontal (e.g., radial) direction, along the gate field, where the vertical direction is along the axis of the nanowire core. In alternative embodiments, portion 7B can be made of the same semiconductor material as the shell 5 but with lower doping concentration than the shell 5. Alternatively, portion 7B may be made of an electrically insulating material or of a different semiconductor material than the shell 5. In one preferred embodiment barrier portion 7B has a higher bandgap than both the shell 5 and core portion 7A. In one embodiment barrier portion 7B has a higher bandgap than the shell 5 and lower doping level than the core portion 7A. Preferably, the barrier portion 7B, in addition to having a larger band gap than the core portion 7A and the shell 5, should have a sufficiently high offset at both the conduction and valence band edge, so that the barrier may efficiently suppress the leakage current. Thus, the barrier portion 7B may comprise lightly doped, intrinsic, semi-insulating semiconductor material having a doping concentration of $10^{16}$ cm$^{-3}$ or lower (e.g., unavoidable impurity level to $10^{16}$ cm$^{-3}$) or it may comprise an electrically insulating material. Portion 7B may be referred to as a "plug" in the radial nanowire device.

Thus, as shown in FIG. 10B, the nanowire core 7 comprises a first (e.g., lower) semiconductor portion 7A of the first (e.g., p) conductivity type having a first (e.g., high) doping concentration and a second (e.g., upper) portion 7B located in the core adjacent to (e.g., over) the first portion 7A. The shell 5 is made of a second (e.g., n) conductivity type semiconductor. The upper portion 7B comprises an electrically insulating material or a semiconductor material having a second doping concentration lower than that of lower portion 7A and of the shell 5. The lower portion 7A of the core electrically contacts a semiconductor source region 3 of the first (e.g., p) conductivity type and the shell electrically contacts a drain region 13 of the second conductivity type. The shell 5 is located adjacent to the upper portion 7B of the core and at least partially overlaps the lower portion 7A of the core to form a pn junction 20. The gate electrode 11 at least partially overlaps the pn junction. The p-side electrode (not shown for clarity) electrically contacts the source 3 while the n-side electrode (not shown for clarity) electrically contacts the drain region 13. The conductivity types (e.g., p and n) may be reversed and other materials than those described above may be used in alternative embodiments.

Figure 10C:
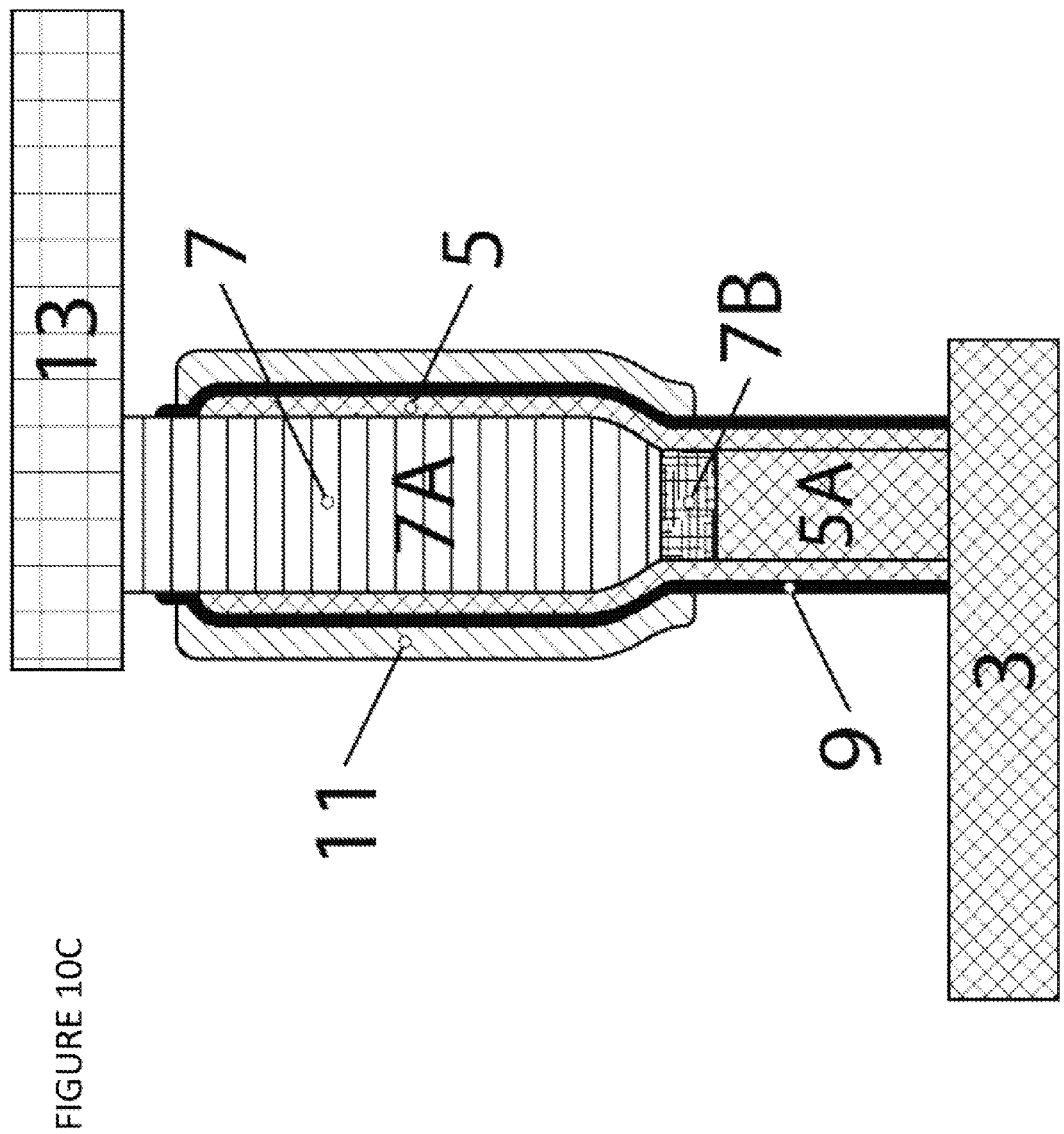
FIG. 10C illustrates an exemplary embodiment of the structure illustrated in FIG. 10B.

FIG. 10C illustrates one embodiment of the structure of the device schematically illustrated in FIG. 10B. The radial tunneling field-effect transistor or gated Esaki diode includes a radial semiconductor nanowire. The tunneling current is modulated in the nanowire between a shell 5, and a core 7, which have opposite majority carriers, such as a p-type core and a n-type shell or vice versa. The core/shell may be grown on top of a stem 5A of a semiconductor with the same conductivity type as the shell 5, e.g. an n-type stem of InAs would for example be suitable for an n-InAs shell. Preferably, the core 7 would include a blocking barrier 7B for the axial leakage current between the stem 5A and the core portion 7A. The blocking barrier 7B may be implemented in the form of a high bandgap semiconductor segment, or as a graded doping profile, which could continue into portion 7A, and in the same material as the core portion 7A. The introduction of a barrier segment 7B would fill the purpose of increasing the radial-to-axial tunneling current ratio as described above.

Preferably, the source 3 and drain 13 electrodes would be formed to the stem segment 5A of the nanowire and to the core portion 7A. Selective etching of the shell 5, on a part of the core/shell segment, at the opposite end of the nanowire, as seen from the stem 5A, would allow for electrode formation directly to the core portion 7A. Passing a current between the stem 5A and/or the shell 5 and the core portion 7A would result in a tunneling current, where the active tunneling interface would be located at the junction between the core portion 7A and shell 5. Furthermore, the nanowire would be clad in an isolator such as a high-k dielectric or oxide 9, possibly deposited by atomic layer deposition for conformal coverage. A third electrode 11, placed over the active tunneling junction, in a gate-all-around device architecture as described above, separated from the shell 5 by an isolator 9, with or without overlap or underlap to adjacent segments (e.g. 7B), would be used to modulate the tunneling current between the core portion 7A and the shell 5. Thus the third electrode (the gate) 11 would apply an electric field in parallel to tunneling current between core portion 7A and shell 5.

The device described above provides a radial tunneling field-effect transistor where the dominating tunneling current is modulated between two segments of the nanowire with different majority carriers, such as e.g. a p-type GaSb core 7 and a n-type InAs shell 5 or vice versa. The device provides a radial tunneling contribution to the current and limits the contribution from thermally excited carriers and diffusive transport under biased conditions. The ratio between the aforementioned contributions is enhanced by a barrier 7B, introduced between the reservoirs of carriers in the source and drain, where the source 3 can be a n-type InAs buffer layer in series with a n-type InAs nanowire stem 5A connected to a n-type InAs shell 5, and the drain can be all or part of a p-type GaSb core 7A connected to a metal electrode 13. The barrier or "plug" 7B may comprise of a high bandgap semiconductor, such as GaAs or InP, or a graded semiconductor and minimizes the leakage currents perpendicular to an applied electric field from the gate, where the gate is positioned so that the dominating tunneling current is parallel to the electric field applied by the gate, i.e., radial tunneling.

The simulations in FIGS. 3-9 use a non-local tunneling model, taking only direct tunneling at the gate region into account. Without wishing to be bound by a particular theory, the inventors presume that this should be reasonably accurate in predicting the ON current as well as the sub threshold slope (SS), in absence of any defect/phonon assisted tunneling which can degrade the inverse sub threshold slope. Any ambipolarity for negative bias is also omitted.

In the simulations of the axial nanowire TFET shown in FIG. 4, underlap means that the gate electrode 11 does not reach the (Al)GaSb lower portion 8 of the nanowire by the noted amount in the Figure (i.e., the gate electrode is located above the pn junction). Overlap means that the gate electrode 11 reaches down over the (Al)GaSb lower portion 8 of the nanowire by the noted amount in FIG. 4 (i.e., the gate electrode extends below the pn junction). In the simulations of the radial nanowire TFET shown in FIG. 5, underlap means that the gate electrode 11 does not reach the end (i.e., the bottom) of the InAs shell 5, while overlap means that the gate electrode 11 reaches below the InAs shell 5.

Both simulated devices show similar minimum SS of about 7 mV/decade, where decade corresponds to a 10 times increase of the drain current. The axial TFET of FIG. 10A, however, is severely degraded in case of gate underlap or overlap. In contrast, the radial TFET of FIG. 10B has better immunity against the underlap and overlap effects, which will allow for a much more robust fabrication scheme, since the gate electrode can be designed to have some amount of overlap or underlap with the shell.

The device shown in FIG. 10B is a preferred embodiment. This structure provides the following advantages compared to the prior art. The upper nanowire "plug" portion 7B blocks the usual large lateral generation of tunnel carriers (parallel to the applied source-drain field). The shell 5 with the drain contact 13 together with the GaSb core portion 7A provides a very steep, radial pn junction (broken or staggered gap alignment) depending on core diameter and shell thickness, doping levels, and material composition (e.g., amount of Sb and Al). The wrap gate 11 forces a field perpendicular to the pn-junction so that the total electric field across the junction (source-drain and gate field) is essentially perpendicular to the pn-junction. This minimizes the potential drop (the vertical part of the potential is constant throughout the cross section through the structure in the element 5 to 7A direction) and therefore the Fermi level is almost constant on both sides of the junction. The parallel part of the field comprises the source-drain potential. The almost stepwise change in Fermi level across the junction induced in this way allows a sub-thermal tunnel generation of carriers that provides a sub-60 mV/dec. sub-threshold swing and a high tunnel current.

Figure 11A:
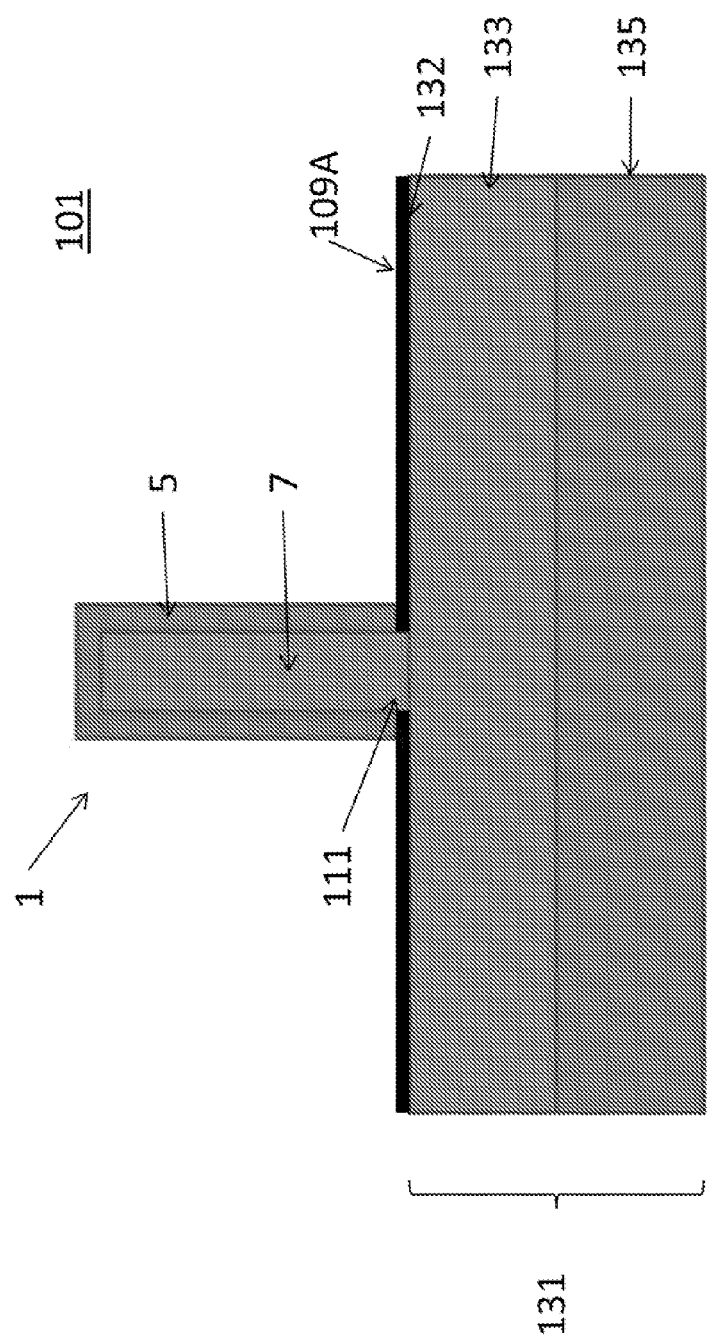
FIGS. 11A-11D are side cross sectional views of multi-junction solar cells of embodiments of the invention.

Another embodiment of the invention provides a polarity inversion in the Esaki diode, which may be used in a formation of a multi-junction solar cell. As shown in FIG. 11A, solar cell 101 includes a planar pn or pin junction solar cell 131 portion and a radial Esaki diode 1 portion upstanding on the planar solar cell 131 upper surface 132. Specifically, the longitudinal axis of the diode 1 may extend perpendicular to the upper surface 132 of the planar solar cell 131.

The planar solar cell may comprise a first region (e.g., upper region or layer) 133 of a first conductivity type (e.g., n-type) and a second region (e.g., lower region or layer) 135 of a second conductivity type (e.g., p-type). Regions 133 and 135 form a pn junction. If desired, an intrinsic layer may be located between regions 133 and 135 to form a pin junction.

The second region 135 may comprise a doped semiconductor substrate, a doped region in the semiconductor substrate or a doped semiconductor layer formed over a semiconductor, conductive (e.g., metal) or insulating (e.g., ceramic, plastic, glass, quartz, etc.) substrate (not shown for clarity). The first region 133 may comprise a doped region in the semiconductor substrate or a doped semiconductor layer formed over the second region 135. Regions 133 and 135 may comprise any type of semiconductor, such as an inorganic semiconductor, for example Group IV (e.g., silicon, germanium, SiGe, etc.), Group III-V (e.g., GaAs, InP, etc.) or Group II-VI (e.g., CdTe, etc.) semiconductor. For example, region 133 may be n-type silicon and region 135 may be p-type silicon.

The upper surface 132 of the planar solar cell 131 may comprise an electrically insulating masking layer 109A, such as silicon nitride, silicon oxide, etc. Preferably, layer 109A is transparent to solar radiation, especially of wavelengths above the wavelengths absorbed in the solar cell junction formed by the core 7 and the shell 5. The nanowire 1 protrudes through an opening 111 in the masking layer 109A.

The nanowire 1 core 7 may be grown on semiconductor region 133 exposed through the opening 111 without using a catalyst as described above. Alternatively, the nanowire 1 core 7 may be first grown on the upper surface 132 of region 133 using a metal catalyst particle, or via selective area growth, followed by the formation of the masking layer 109A around the nanowire core and then the growth of the shell 5 around the exposed core 7, as also described above.

The nanowire core 7 and the first region 133 of the planar solar cell 131 contact each other and have the same conductivity type (e.g., n-type). The shell 5 and the second region 135 of the planar solar cell 131 do not contact each other and have the same conductivity type (e.g., p-type) different from that of the core 7 and the first region 133.

Preferably, the structure shown in FIG. 11A forms two pn junctions of a multi-junction planar/nanowire hybrid solar cell, where the nanowire junction is preferably III/V semiconductor based and the substrate (e.g., planar solar cell) junction is Si based. The core and shell regions may comprise III-V materials, such as GaAs/InP for example.

The radial nanowire Esaki diode is a "circumventing" (e.g., circumferential) heterostructure Esaki diode utilizing heavily doped n++/p++ core/shell region and a band gap heterostructure discontinuity for improved performance. The Esaki band pass polarity inversion is advantageous in retaining band energy from carriers excited in the high energy bandgap nanowire solar cell. This also provides the advantage for matching Esaki diode area to the junction excitation volumes, in order to facilitate critical current matching between the junctions. This is especially advantageous over using axial nanowire Esaki diodes.

Figure 11B:
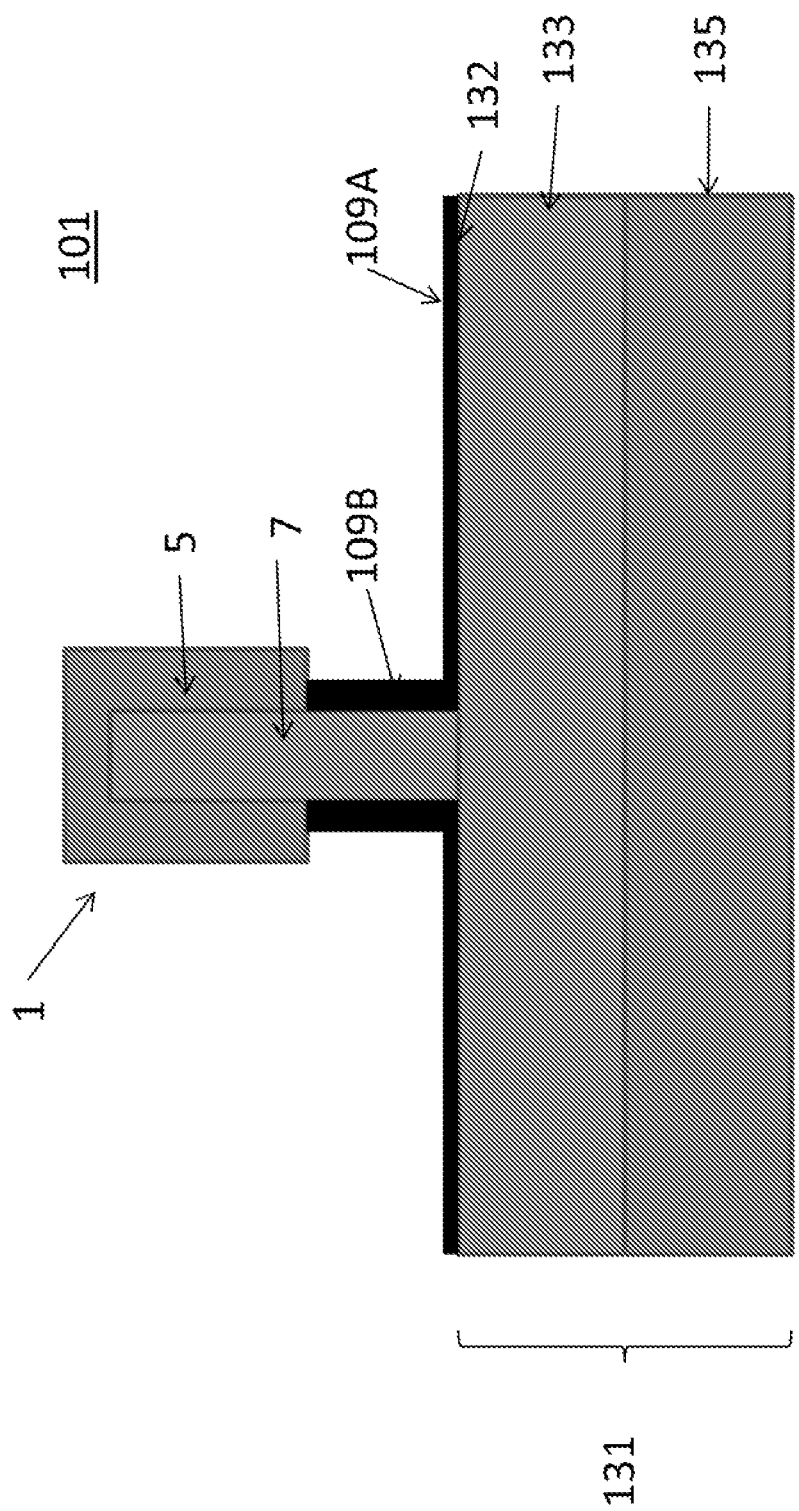

FIG. 11B illustrates another embodiment of the multi-junction solar cell 101 in which the shell 5 comprises a bulb or a quasi-bulk region at the top part of the core 7. If desired, an additional masking layer 109B may be formed between the shell 5 and the first masking layer 109A.

Figure 11C:
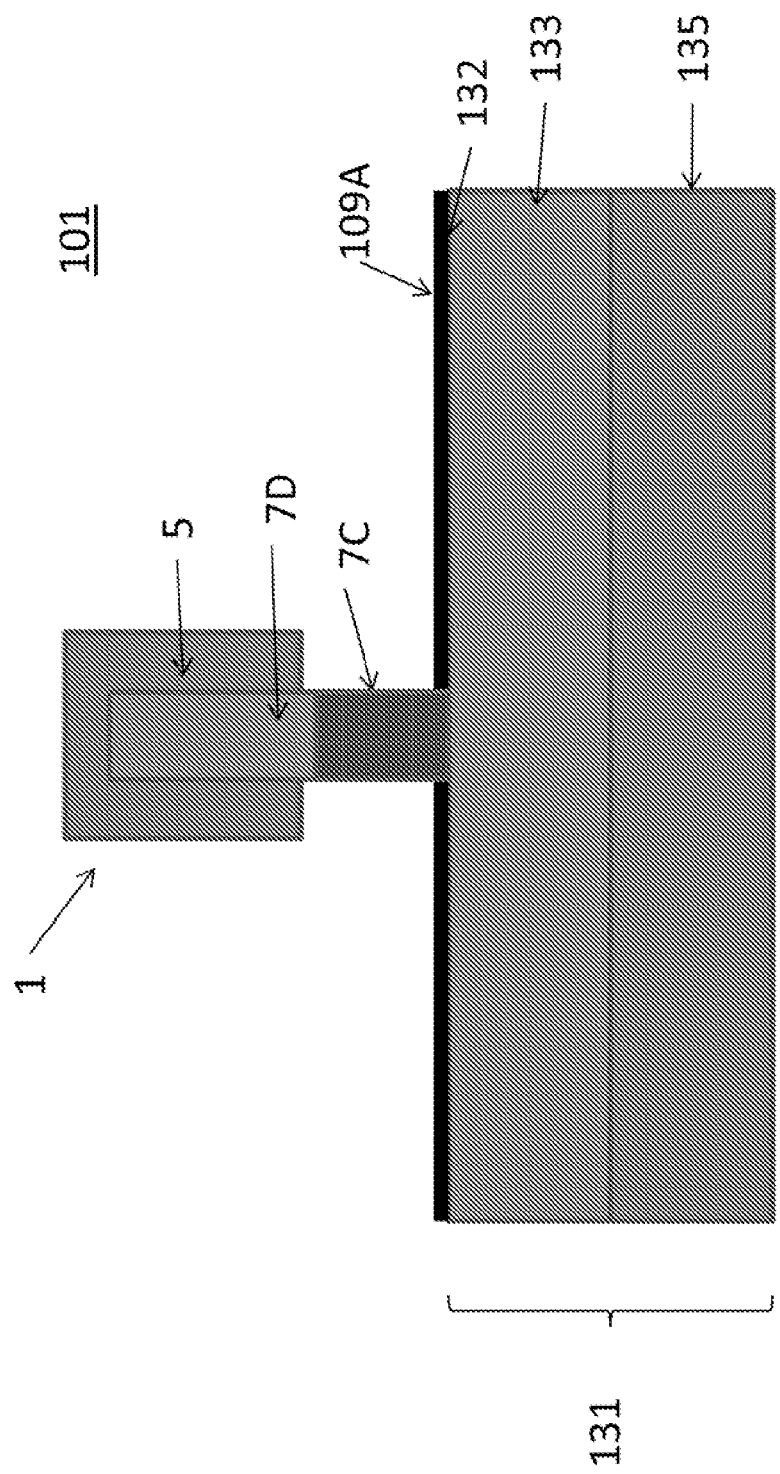

FIG. 11C illustrates another embodiment multi-junction solar cell 101 in which the core 7 comprises a heterostructure containing lower 7C and upper 7D regions composed of different III-V semiconductor materials, and/or different doping levels, of the first conductivity type, of special value for the gated TFET applications described above.

Figure 11D:
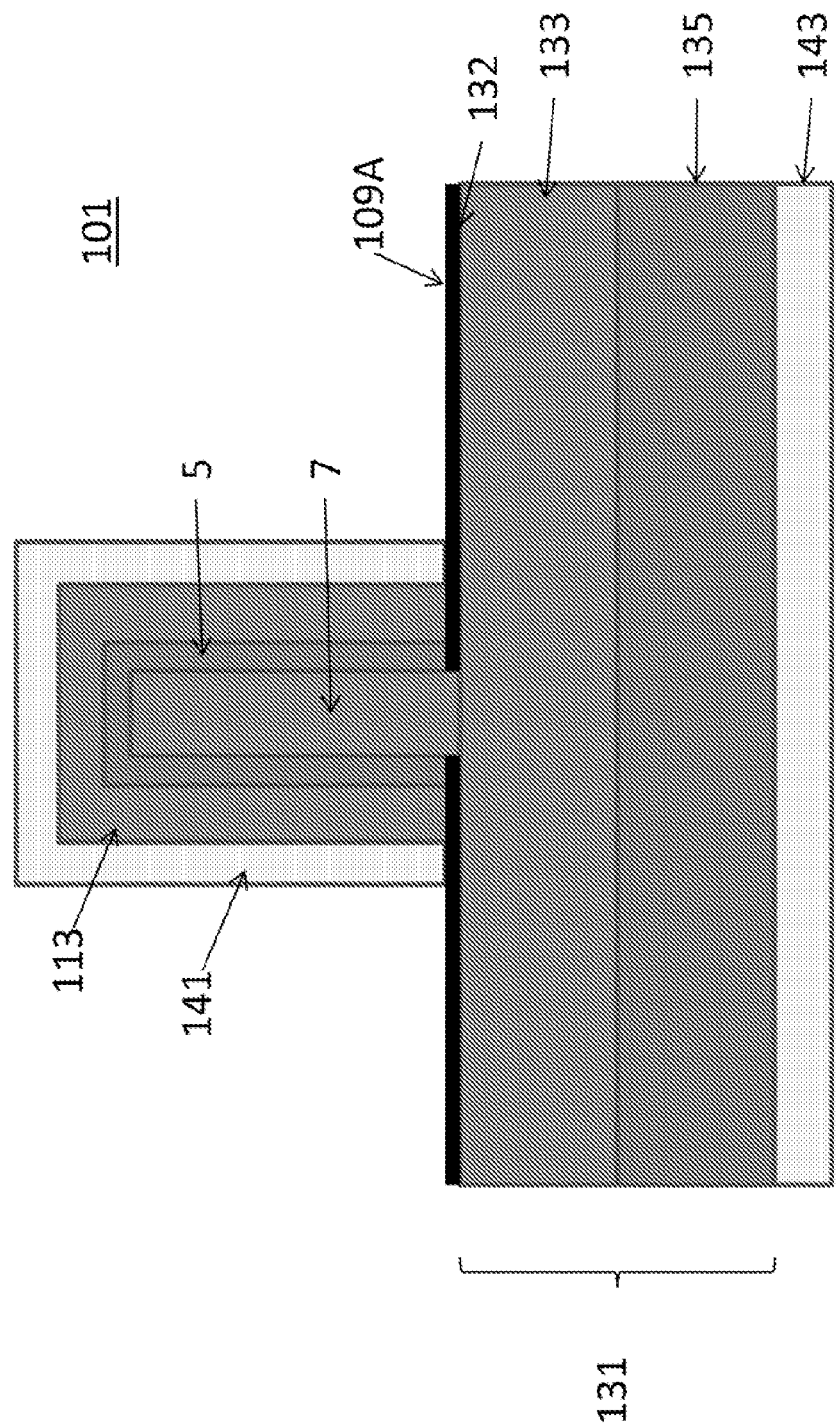

FIG. 11D illustrates the connection of the n-side electrode 141 and p-side electrode 143 to the solar cell 101. Prior to forming the n-side (e.g., the nanowire side) electrode 141, an additional shell layer, bulk or quasi-bulk region 113 of the first conductivity type (e.g., n-type) is formed over and in contact with the shell 5 of the second conductivity type (e.g., p-type). Hence, in this implementation the radial sequence in the nanowire will consist of (in this version): n++/p++/p/i/n/n+ regions, where the first n++/p++ junction constitutes the Esaki tunnel diode, the p/i/n diode is the active, large band-gap solar cell, and the n+ layer is for providing the contact surface layer of the nanowire solar cell.

The n-side electrode 141 is then formed in contact with region 113. If the nanowire side of the solar cell 101 will be exposed to solar radiation, then electrode 141 is made of an electrically conductive material that is substantially transparent to solar radiation, such as a transparent conductive oxide (TCO), for example, indium tin oxide, zinc oxide, etc. The p-side electrode 143 is formed in contact with region 135 of the planar solar cell 131. Electrode 143 may be made of any suitable metal, such as Al, Cu, Ti, Ag, etc. and their alloys.

As shown in FIG. 11D, the Esaki diode forms the "third junction" of the multi-junction solar cell 101, switching the polarity of the carriers in order to put the planar and the radial junctions in series without any metallic contact that would divert, or spill the "local entropy" that the bandgap height retains for the carriers.

If desired, the conductivity type of the semiconductor regions may be reversed. Furthermore, while one nanowire 1 is illustrated, it should be understood that a large number (e.g., plurality) of nanowires are formed on the planar solar cell 131, in such a way that (virtually) all photons are trapped by the wire array such that the substrate pn-junction is only exposed to photons that passed through the nanowire pn-junction with the higher band-gap.

Figures 12A, 12B:
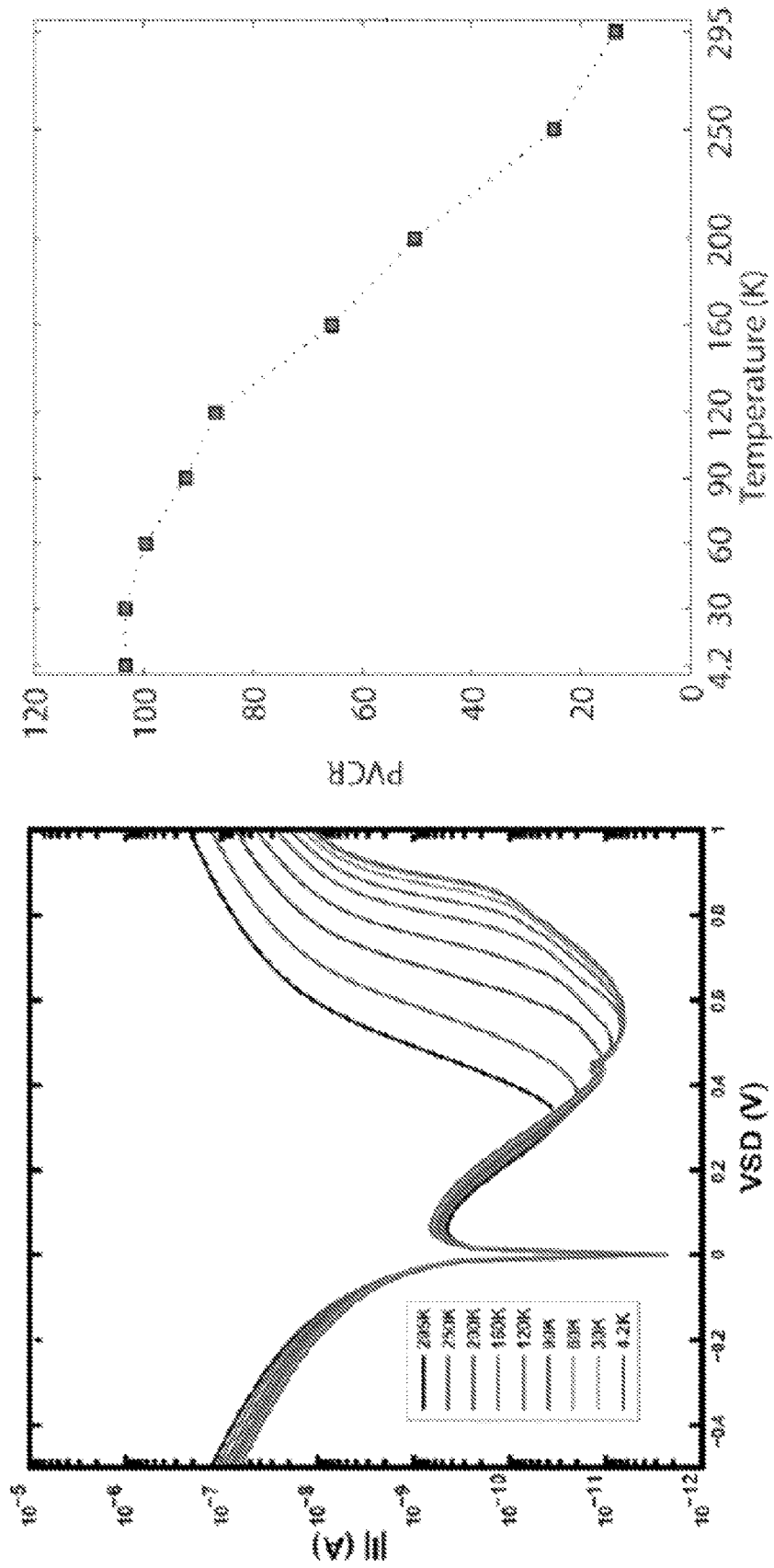
FIGS. 12A and 12B are respective plots of current versus voltage as a function of temperature and PVCR versus temperature to illustrate temperature dependent current-voltage characteristics from an Esaki diode according to an embodiment of the invention.

FIGS. 12A and 12B illustrate temperature dependent characteristics of an Esaki diode according to an embodiment of the invention. FIG. 12A is a plot of current versus voltage as a function of temperature and FIG. 12B is a plot of PVCR versus temperature, where PVCR is peak-to-valley current ratio (PVCR=$I_{peak}/I_{valley}$) for a radial nanowire Esaki diode. As can be seen in FIG. 12A, the plot includes a dip (i.e., valley) in current as a function of voltage, at all measured temperatures between 4.2K and 295K. This is characteristic of a negative differential resistance and Esaki tunneling diode behavior. FIG. 12B illustrates that the PVCR is above 10 for all measured temperatures of 295K and lower (e.g., a PVCR of above 10, such as 11 to 14, at about room temperature of 295K), and the PVCR is above 100, such as 101 to 105 at lower temperatures (e.g., below 60K, such as at 4.2-30K).

The diode comprises a n-type, heavily sulfur-doped InP core and a heavily Zn-doped InGaAs shell. This material combination, or other suitable materials, may be used for the core and the shell, exemplified but not limited by GaAsSb, GaInAs, InP, and/or InPAs, in any and/or all embodiment devices described above. Furthermore, band structure engineering may be accomplished by scaling the core/shell dimensions into the quantum regime which allows for precise control of the band alignment. In addition, carrier transport may be controlled by the discrete energy levels formed in a confined semiconductor allowing for a high selectivity of carriers available for transport.

The preceding description of the disclosed embodiments is provided to enable any person skilled in the art to make or use the described embodiment. Various modifications to these embodiments will be readily apparent to those skilled in the art, and the generic principles defined herein may be applied to other embodiments without departing from the scope of the disclosure. Thus, the present invention is not intended to be limited to the embodiments shown herein but is to be accorded the widest scope consistent with the following claims and the principles and novel features disclosed herein.

The invention claimed is:

1. A device comprising a radial nanowire Esaki diode, wherein the radial nanowire comprises a semiconductor core of a first conductivity type and a semiconductor shell of a second conductivity type different from the first conductivity type, wherein:
    the device comprises a gated radial nanowire Esaki diode;
    the device comprises a tunneling field effect transistor (TFET);
    the device further comprises a gate insulating layer located around the shell and a gate electrode located adjacent to the gate insulating layer;
    the nanowire core comprises a lower semiconductor portion of the first conductivity type having a first doping concentration and an upper portion located over the lower portion;
    the upper portion comprises an electrically insulating material or a semiconductor material having a second doping concentration lower than the first doping concentration of the lower portion and lower than a doping concentration of the shell;
    the lower portion of the core electrically contacts a semiconductor source region of the first conductivity type and the shell electrically contacts a drain region of the second conductivity type;
    the shell is located adjacent to the upper portion of the core and at least partially overlaps the lower portion of the core to form a pn junction; and
    the gate electrode at least partially overlaps the pn junction.

2. A device comprising a radial nanowire Esaki diode, wherein the radial nanowire comprises a semiconductor core of a first conductivity type and a semiconductor shell of a second conductivity type different from the first conductivity type, wherein:
    the device comprises a gated radial nanowire Esaki diode;
    the device comprises a tunneling field effect transistor (TFET); and
    the device further comprises a gate insulating layer located around the shell and a gate electrode located adjacent to the gate insulating layer; and
    the shell is sufficiently thin to form a quantum well between the gate insulating layer and the core.

3. The device of claim 2, wherein at least one of the core and the shell is sufficiently thin to increase energy of charge carriers in the device.

4. A device comprising a radial nanowire Esaki diode, wherein the radial nanowire comprises a semiconductor core of a first conductivity type and a semiconductor shell of a second conductivity type different from the first conductivity type,
    the device comprises a gated radial nanowire Esaki diode;
    the device comprises a tunneling field effect transistor (TFET); and
    the device further comprises a gate insulating layer located around the shell and a gate electrode located adjacent to the gate insulating layer; and
    further comprising a barrier region located between the core and at least one of a source region and a drain region of the TFET.

5. The device of claim 4, wherein the barrier region material has a higher band gap than the semiconductor core material.

6. The device of claim 5, wherein:
    the barrier region material has a higher band gap than both the semiconductor core material and the semiconductor shell material;
    the barrier region comprises a plug shaped region having a sufficiently high band offset at both conduction and valence band edge to suppress leakage current; and
    the barrier region comprises an electrically insulating material or a lightly doped, intrinsic, or semi-insulating semiconductor material having a doping concentration of $10^{16}$ cm$^{-3}$ or lower.

* * * * *